United States Patent
Wada

(10) Patent No.: US 8,550,006 B2
(45) Date of Patent: Oct. 8, 2013

(54) SIDE BUFFER FOR A TRANSPORT VEHICLE THAT TRAVELS ALONG THE CEILING, AND TRANSPORT VEHICLE SYSTEM

(75) Inventor: Eiji Wada, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 13/637,914

(22) PCT Filed: Apr. 2, 2010

(86) PCT No.: PCT/JP2010/002444
§ 371 (c)(1),
(2), (4) Date: Sep. 27, 2012

(87) PCT Pub. No.: WO2011/125097
PCT Pub. Date: Oct. 13, 2011

(65) Prior Publication Data
US 2013/0019772 A1    Jan. 24, 2013

(51) Int. Cl.
*B61B 3/00*    (2006.01)
(52) U.S. Cl.
USPC ............ 104/89; 104/93; 104/90; 104/91; 104/92; 414/267; 414/280; 414/281
(58) Field of Classification Search
USPC ........ 104/88.01, 89, 90, 91, 92, 93, 106, 111, 104/124; 414/267, 280, 281
See application file for complete search history.

(56) References Cited

U.S. PATENT DOCUMENTS

| | | | | |
|---|---|---|---|---|
| 5,660,114 | A * | 8/1997 | Gruber | 104/168 |
| 5,983,803 | A * | 11/1999 | Eberle | 105/150 |
| 6,152,669 | A * | 11/2000 | Morita et al. | 414/217 |
| 6,183,184 | B1 * | 2/2001 | Shiwaku | 414/281 |
| 7,437,999 | B2 * | 10/2008 | Nakao | 104/106 |
| 7,578,240 | B2 * | 8/2009 | Shiwaku | 104/89 |
| 7,735,424 | B2 * | 6/2010 | Nakashima et al. | 104/89 |
| 7,789,019 | B2 * | 9/2010 | Kato | 104/111 |
| 7,828,164 | B2 * | 11/2010 | Wada | 212/331 |
| 7,845,284 | B2 * | 12/2010 | Izumi et al. | 104/88.02 |
| 2004/0025738 | A1 * | 2/2004 | Chapman | 104/93 |

(Continued)

FOREIGN PATENT DOCUMENTS

| | | |
|---|---|---|
| JP | 57-152037 U1 | 9/1982 |
| JP | 09-139410 A | 5/1997 |
| JP | 2007-158219 A | 6/2007 |
| JP | 2009-196748 A | 9/2009 |

OTHER PUBLICATIONS

Official Communication issued in International Patent Application No. PCT/JP2010/002444, mailed on Jun. 29, 2010.

(Continued)

*Primary Examiner* — Jason C Smith
(74) *Attorney, Agent, or Firm* — Keating & Bennett, LLP

(57) ABSTRACT

A side buffer includes a bottom portion on which a FOUP may be placed, a restriction portion, an article receiving portion, and a link portion. The restriction portion is movable between a restricting position and a retracted position. At the restricting position, the restriction portion restricts an inclination of the FOUP on the bottom portion. At the retracted position, the restriction portion allows the FOUP to move between the bottom portion and a position directly above the bottom portion. The article receiving portion is disposed so as to receive a force from the FOUP placed on the bottom portion. The link portion moves the restriction portion from the retracted position to the restricting position with the received force.

12 Claims, 9 Drawing Sheets

(56) References Cited

U.S. PATENT DOCUMENTS

| | | | |
|---|---|---|---|
| 2006/0219126 A1* | 10/2006 | Nakao | 104/106 |
| 2006/0222479 A1* | 10/2006 | Shiwaku et al. | 414/267 |
| 2007/0163461 A1* | 7/2007 | Shiwaku | 104/89 |
| 2008/0014061 A1* | 1/2008 | Izumi | 414/281 |
| 2008/0092769 A1* | 4/2008 | Izumi et al. | 105/148 |
| 2008/0168920 A1* | 7/2008 | Nakashima et al. | 104/124 |
| 2009/0120320 A1* | 5/2009 | Kato | 104/89 |
| 2009/0206048 A1* | 8/2009 | Wada | 212/71 |
| 2013/0019772 A1* | 1/2013 | Wada | 104/93 |

OTHER PUBLICATIONS

English translation of Official Communication issued in corresponding International Application PCT/JP2010/002444, mailed on Dec. 13, 2012.

English translation of JP 57-152037, Sep. 24, 1982.

* cited by examiner

SIDE BUFFER FOR A TRANSPORT VEHICLE THAT TRAVELS ALONG THE CEILING, AND TRANSPORT VEHICLE SYSTEM

BACKGROUND OF THE INVENTION

1. Field of the Invention

The present invention relates to a side buffer for a conveying vehicle traveling along a ceiling and a conveying vehicle system.

2. Description of the Related Art

A semiconductor manufacturing plant includes a conveying system for conveying a container, in which substrates are contained, between processing apparatuses.

For example, the conveying system is provided with a rail suspended from a ceiling, and a conveying vehicle supported by the rail so as to be suspended therefrom. The conveying vehicle conveys a front opening unified pod (FOUP), in which substrates are contained.

Moreover, a side buffer is disposed adjacent to the rail so as to be able to adjust the timing for conveying the FOUP to the processing apparatus (See, for example, Japanese Patent Application Laid-Open No. 2009-196748).

The side buffer described in Japanese Patent Application Laid-Open No. 2009-196748 is described below. Note that, in the following descriptions about the technology described in Japanese Patent Application Laid-Open No. 2009-196748, reference numerals assigned to components are those used in Japanese Patent Application Laid-Open No. 2009-196748, and are not related to reference numerals which are illustrated in the drawings of the present application.

The side buffer described in Japanese Patent Application Laid-Open No. 2009-196748 includes an anti-tip member 350 in order to prevent a FOUP from falling from a placement table 300 due to shock caused by an earthquake, and the like.

The anti-tip member 350 has an angular U-letter shape. The anti-tip member 350 is constituted of a tilting restriction portion 350a, a connecting portion 350b, and a fixing portion 350c. The tilting restriction portion 350a, the connecting portion 350b, and the fixing portion 350c are integrally formed. The fixing portion 350c is a plate-shaped portion and is screwed to a beam 360 of the placement table 300. The connecting portion 350b is a plate-shaped portion extending upward from the fixing portion 350c. The tilting restriction portion 350a is a plate-shaped portion extending perpendicular to the connecting portion 350b. In other words, the tilting restriction portion 350a is displaced above a position where an article is placed on the placement table 300.

In Japanese Patent Application Laid-Open No. 2009-196748, an article 500 is the FOUP and includes a protruding portion 510 at the lowermost portion of aside portion. An abutment surface portion 510a is disposed on an upper surface of the protruding portion 510. When the article 500 is to be placed onto the placement table 300, the article 500 is moved by a conveying vehicle 3 in a substantially horizontal direction toward the placement table 300. During this movement operation, the position of the abutment surface portion 510a of the article 500 in a height direction is lower than the position of the tilting restriction portion 350a in the height direction. The article 500 is conveyed above the placement table 300 by this movement operation, and then is lowered so as to be placed onto the placement table 300.

When the article 500 tilts while having been placed on the placement table 300, the abutment surface portion 510a abuts against the tilting restriction portion 350a. Accordingly, the range of tilting of the article 500 placed on the placement table 300 is restricted.

In the above-mentioned placement table 300, the tilting restriction portion 350a is disposed above the portion where the article 500 is placed on the placement table 300. Therefore, the article cannot be moved in upward and downward directions between a position above the tilting restriction portion 350a and the placement table 300.

In a conveying system described in Japanese Patent Application Laid-Open No. 2009-196748, the taking-in and taking-out of the article 500 are performed at only one side of the placement table. This is because an edge of a lid of the FOUP protrudes from the side surface so that the lid of the FOUP would make contact with the tilting restriction portion when the taking-in and taking-out of the article 500 is performed at the opposite side of the placement table. Accordingly, the technology described in Japanese Patent Application Laid-Open No. 2009-196748 cannot be applied to a conveying vehicle system in which a FOUP having a lid protruding from the side surface is taken-in and taken-out at both sides of the placement table.

SUMMARY OF THE INVENTION

Preferred embodiments of the present invention enhance flexibility of directions in which an article may be taken-in and taken-out in a case of a side buffer including an anti-tip mechanism.

Various aspects, features, characteristics, etc. of preferred embodiments of the present invention described below can be optionally combined according to need or preference.

A side buffer according to a first preferred embodiment of the present invention is a side buffer disposed in a conveying vehicle system having a conveying vehicle traveling along a ceiling. The side buffer includes a placement portion on which an article may be placed; a suspension member which suspends the placement portion from the ceiling; a restriction portion movable between a restricting position, where an inclination of the article on the placement portion is restricted, and a retracted position, where the article is allowed to be moved among the placement portion, a position directly above the placement portion and above the restriction portion, and a position directly above the placement portion and below the restriction portion; an article receiving portion disposed so as to receive a force from the article placed on the placement portion; and a link portion which moves the restriction portion from the retracted position to the restricting position with the received force.

When the restriction portion is at the restricting position, the tilting of the article is restricted so that the tipping of the article can be prevented. On the other hand, when the restriction portion is at the retracted position, the article can be moved between the placement portion and the position directly above the placement portion so that the amount of flexibility in transferring the article can be enhanced. For example, the article can be placed onto the placement portion from the position directly above the placement portion.

Moreover, the link portion uses the force from the article to move the restriction portion from the retracted position to the restricting position, so that no special driving member is needed.

The restriction portion may be disposed at each of two sides of the article in a traveling direction of the conveying vehicle when the restriction portion is at the restricting position. Moreover, the article receiving portion may be disposed such that, when the article is placed on the placement portion, portions of the article near its end portion in a horizontal direction and perpendicular or substantially perpendicular to the traveling direction may be placed on the article receiving portion.

In this case, when the article is placed on the article receiving portion, the link portion moves the restriction portion from the retracted position to the restricting position. Therefore, the operation of placing the article onto the placement portion can result in the movement of the restriction portion from the retracted position to the restricting position.

The side buffer may be further provided with a biasing portion which presses the restriction portion toward the retracted position. In this case, when the above-mentioned force is removed, the restriction portion is positively moved to the retracted position.

The side buffer may include a first plate as the restriction portion, a second plate as the article receiving portion which is opposite to the first plate, and a third plate as the link portion which connects the first plate with the second plate.

The first plate, the second plate, and the third plate may be configured to have a U-letter shape.

The restriction portion, the article receiving portion, and the link portion may be integral with each other so as to define a single unit.

The side buffer may further include a rotation shaft, and the restriction portion may be disposed so as to be rotatable about the rotation shaft.

The article may include a protrusion on its surface. The restriction portion may be disposed such that an inclination of the article is restricted by restricting a range of movement of the protrusion at the restricting position.

The side buffer may include a first unit including the restriction portion, the article receiving portion, and the link portion. Moreover, the side buffer may include a second unit including another restriction portion, another article receiving portion, and another link portion. The first unit is disposed on one side of the placement portion, and the second unit is disposed on the other side which is opposite to the one side where the first set is disposed. In this case, the tilting of the article is restricted by the restriction portions from both sides, so that the position of the article can be more stably maintained even when a shock is applied thereto.

A conveying vehicle system according to another preferred embodiment of the present invention is provided with any one of the above-mentioned side buffers, and a conveying vehicle which moves the article in upward and downward directions between the placement portion and the position directly above the placement portion and higher than the restriction portion.

In the side buffer according to various preferred embodiments of the present invention, the restriction portion can be moved between the restricting position and the retracted position so that the flexibility of directions in which the article may be taken-in and taken-out can be enhanced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

1. First Preferred embodiment
1-1. Configuration of FOUP

Figure 1:
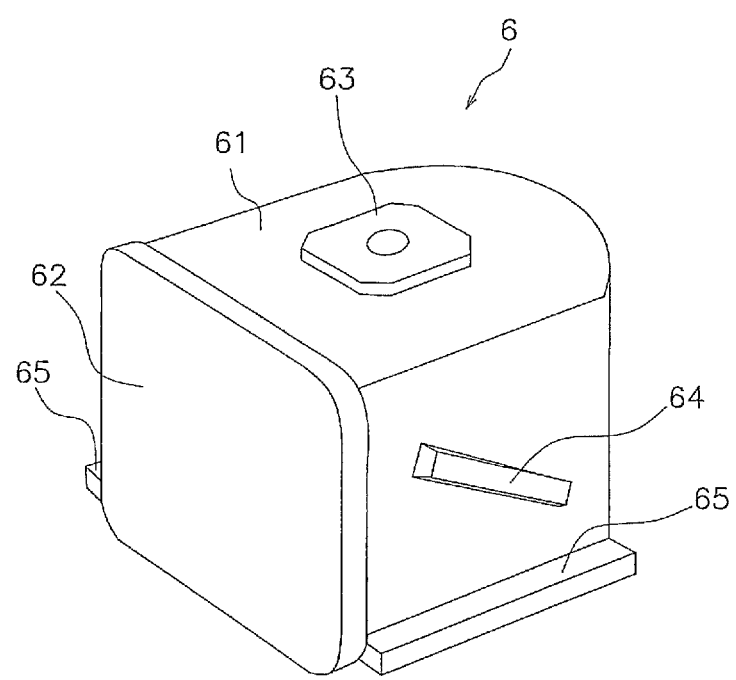
FIG. 1 is a perspective view illustrating an external appearance of a FOUP according to a preferred embodiment of the present invention.

Referring to FIG. 1, a description is given of a configuration of a FOUP 6 which is conveyed by a conveying vehicle system 1 described below.

As illustrated in FIG. 1, the FOUP 6 includes a pod main body 61, a lid 62, an upper flange 63, a handle 64, and a lower flange 65.

The pod main body 61, which preferably is a container in the shape of a substantially rectangular parallelepiped, can contain semiconductor substrates therein, for example.

The upper flange 63 is disposed substantially at the center of an upper surface of the pod main body 61. The upper flange 63 includes a plate parallel to the upper surface of the pod main body 61, and a support portion which connects the plate with the pod main body 61 and projects upward from the pod main body 61.

The handle 64 has a shape that is elongated in one direction. Each of the side surfaces, which are opposite to each other, of the pod main body 61 is preferably provided with the handle 64. The "side surface" here means a surface, among the surfaces of the pod main body 61, which abuts against both the upper surface of the pod main body 61 and the lid 62. The handle 64 is disposed so as to be inclined with respect to the lower side of the side surface. Specifically, the handle 64 is disposed such that one end portion, which is closer to the lid 62, of the end portions in a longitudinal direction of the handle 64, is positioned closer to the upper surface of the pod main body 61, and the other end portion is positioned to be farther from the upper surface of the pod main body 61.

The lower flange 65 is disposed along the lower side (i.e. the side between the side surface and the lower surface of the pod main body 61) of the same side surface as that on which the handle 64 is disposed. The lower flange 65 projects in a direction that is perpendicular or substantially perpendicular to the side surface, namely, in a direction parallel or substantially parallel to the lower surface of the pod main body 61.

1-2. Configuration of Conveying Vehicle System

Figure 2:
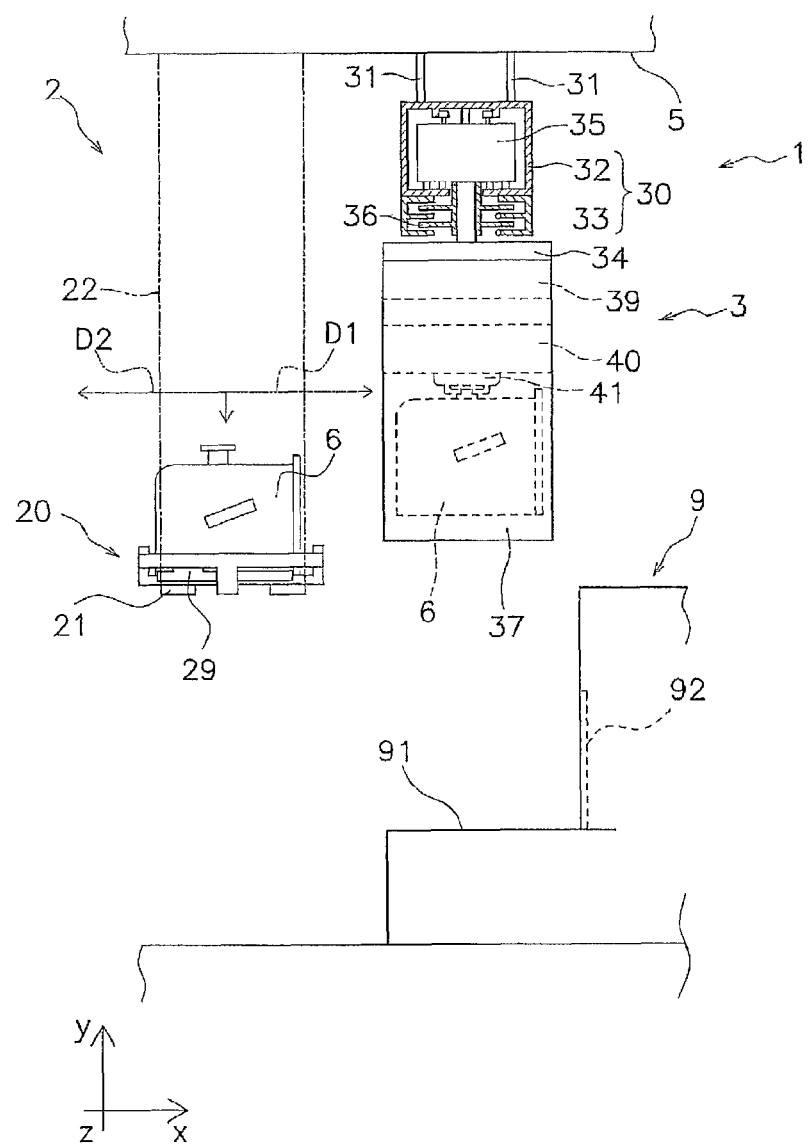
FIG. 2 is a front view illustrating an overview of a conveying vehicle system according to a preferred embodiment of the present invention.

Referring to FIG. 2, the configuration of a conveying vehicle system is described.

The conveying vehicle system 1 according to the present preferred embodiment may be applied to a semiconductor manufacturing system, for example. The conveying vehicle system 1 conveys the FOUP 6 between a plurality of processing apparatuses 9.

1-3. Configuration of Conveying Vehicle System

Referring to FIG. 2, the configuration of the conveying vehicle system 1 is described. Note that, an X-axis direction is a horizontal direction in FIG. 2, a Y-axis direction is a longitudinal direction in FIG. 2 (i.e., a vertical direction), and a Z-axis direction is a direction perpendicular to the sheet of FIG. 2.

The conveying vehicle system 1 is a system in which a plurality of conveying vehicles 3 travel along a given route. As illustrated in FIG. 2, the conveying vehicle system 1 includes the conveying vehicle 3, a traveling rail 30, and a supporting column 31.

As illustrated in FIG. 2, the traveling rail 30 is suspended from a ceiling 5 of a clean room via the supporting column 31. The traveling rail 30 includes a traveling rail main body 32 and a power supply rail 33. The traveling rail 30 is disposed such that its longitudinal direction is parallel or substantially parallel to the Z-axis. A clean room is not the only place where the conveying vehicle system may be disposed. Even in the case where the conveying vehicle system is disposed in a room other than a clean room, the traveling rail may be suspended from the ceiling of the room.

The conveying vehicle 3 preferably is a suspension-type conveying vehicle. As illustrated in FIG. 2, the conveying vehicle 3 includes a base 34, a traveling drive portion 35, a power receiving portion 36, two covers 37, a lateral movement mechanism 39, a lifting drive portion 40, and a lifting table 41. The traveling drive portion 35 is connected with the base 34 and can travel in the traveling rail main body 32. The power receiving portion 36 can receive power from the power supply rail 33. The two covers 37 are fixed to the base 34 so as to sandwich the FOUP 6 therebetween in the traveling direction of the conveying vehicle 3 (the longitudinal direction of the traveling rail 30).

The lateral movement mechanism 39 can move the lifting drive portion 40, lifting table 41, and the FOUP 6 in the X-axis direction. The lifting drive portion 40 can move the lifting table 41 up and down in the Y-axis direction via a suspension member, such as a belt, a wire, or a rope, and the like. The lifting table 41 can clamp the upper flange 63 of the FOUP 6 with its hand, and release the clamping of the same.

1-4. Configuration of Side Buffer

Entire Configuration

Referring to FIGS. 2 to 5, the configuration of a side buffer 2 is described. Note that, in FIG. 5, the portions disposed in front of the cross-section are illustrated with alternate long and short dash lines.

The side buffer 2 is a mechanism disposed adjacent to the traveling rail 30. The side buffer 2 is configured such that the FOUP 6 can be temporarily placed thereon.

As illustrated in FIGS. 2 to 5, the side buffer 2 is provided with a frame member 20, a beam 21, a supporting column 22, and an anti-tip mechanism 29.

The beam 21 has a shape that is elongated in the Z-axis direction. Two beams 21 are used as one set.

The supporting column 22 (suspension member) is fixed at its first end to the beam 21, and at its second end to the ceiling 5. Thus, the supporting column 22 suspends the beam 21 and other members fixed to the beam 21 from the ceiling 5. Note that, in FIG. 2, the each two supporting columns 22 are positioned in front of and behind the FOUP 6 and the bottom portion 23 so that the two supporting columns 22 are illustrated with alternate long and short dash lines for convenience of explanation.

The frame member 20 is supported by the beam 21. The frame member 20 is provided with the bottom portion 23 (placement portion), side panels 24, a front panel 251, and a rear panel 252.

Figure 3:
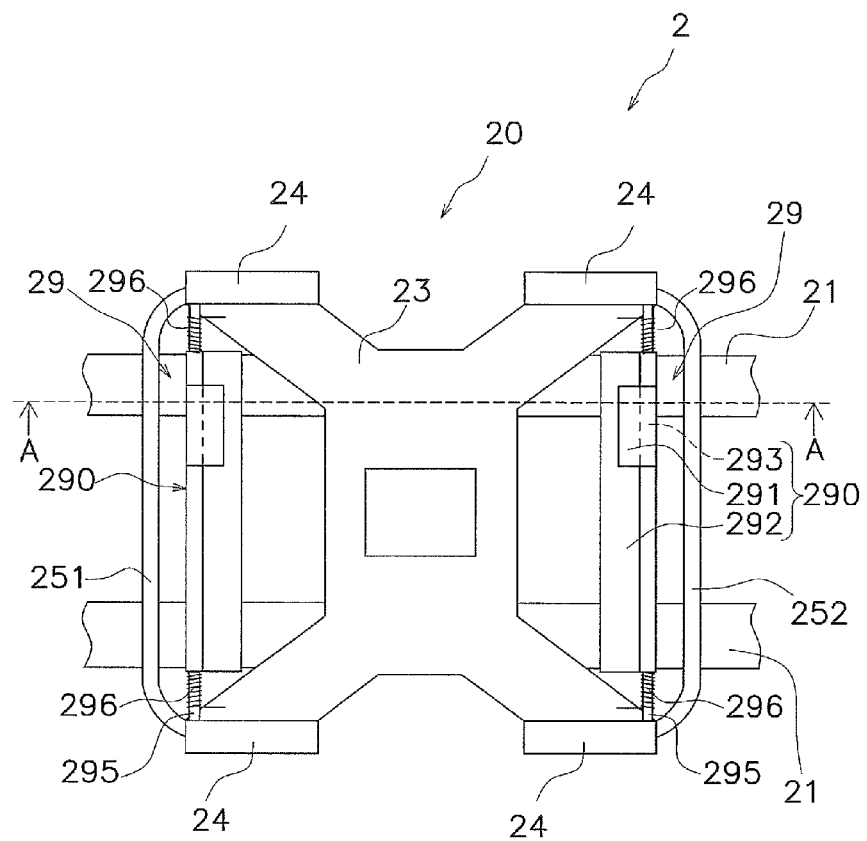
FIG. 3 is a plan view of a side buffer included in the conveying vehicle system of FIG. 2.
Figure 3:
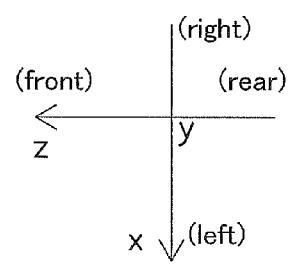

As illustrated in FIG. 3, the bottom portion 23 is a plate-shaped member having a substantially X-letter shape. The bottom portion 23 is fixed to the beam 21 via a screw, or other suitable fixing member.

Figure 4:
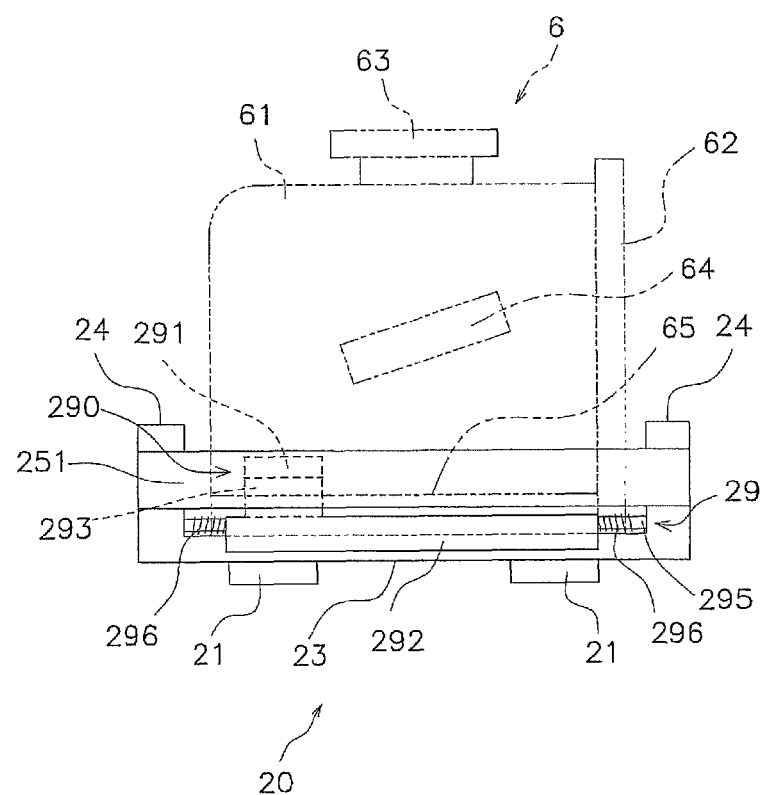
FIG. 4 is a front view of the side buffer.
Figure 4:
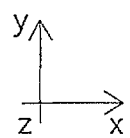

As illustrated in FIG. 3, the four side panels 24 are disposed such that the surfaces thereof become parallel or substantially parallel to the Z-axis. Two of the four side panels 24 are disposed at the right edge of the bottom portion 23 (the edge on the upper side in FIG. 3) so as to be aligned in the Z-axis direction. The other two side panels 24 are disposed at the left edge of the bottom portion 23 (the edge on the lower side in FIG. 3) so as to be aligned in the Z-axis direction. As illustrated in FIG. 4, the side panel 24 is disposed so as to protrude from the bottom portion 23 in the upward direction (the positive Y-axis direction).

Figure 5:
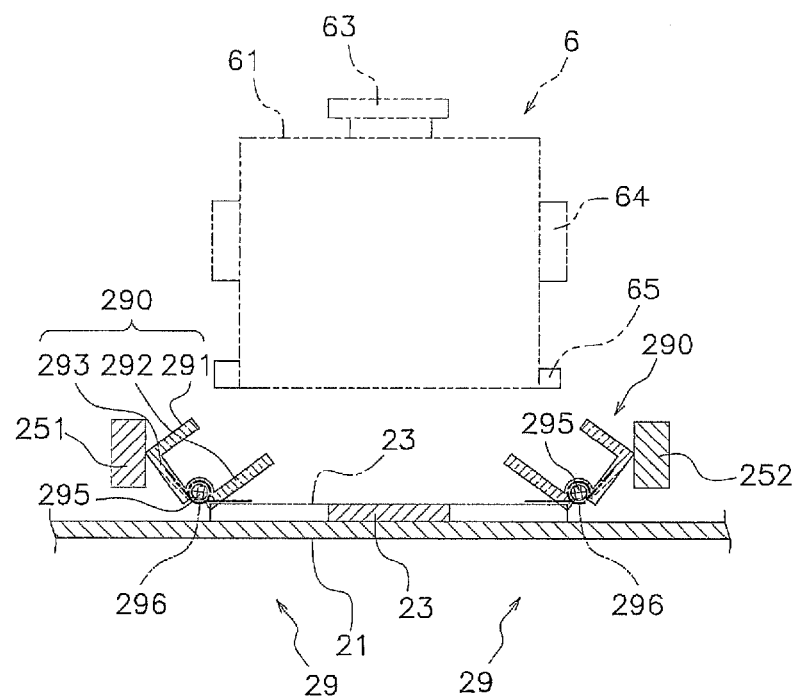
FIG. 5 is a cross-sectional view of the side buffer taken in a direction of arrow A-A in a state in which the FOUP is removed from the side buffer.
Figure 5:
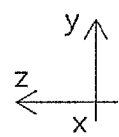

As illustrated in FIG. 3, the front panel 251 and the rear panel 252 are disposed so as to be opposite to each other in the Z-axis direction. As illustrated in FIG. 5, the front panel 251 and the rear panel 252 are disposed so as to be perpendicular or substantially perpendicular to the surface of the bottom portion 23. In other words, the front panel 251 and the rear panel 252 are disposed so as to be parallel or substantially parallel to the X-Y plane. Two ends of the front panel 251 in the X-axis direction are respectively connected with the front end of the right front (upper left in FIG. 3) side panel 24 and the front end of the left front (lower left in FIG. 3) side panel 24. Two ends of the rear panel 252 in the X-axis direction are respectively connected with the rear end of the right rear side panel 24 (upper right in FIG. 3) and the rear end of the left rear side panel 24 (lower right in FIG. 3).

According to such an arrangement, gaps exist between the front panel 251 and the bottom portion 23, and between the rear panel 252 and the bottom portion 23. A restriction member 290 described below is disposed in this gap.

The frame member 20 may be integrally formed as a whole with a resin, or may be formed by assembling a plurality of components.

Configuration of Anti-Tip Mechanism

Referring to FIGS. 3 to 5, the configuration of the anti-tip mechanism 29 is described. The anti-tip mechanism 29 is a mechanism that prevents the FOUP 6 from tipping, even when the side buffer 2 is shaken. Note that, in FIG. 3, the positions of the components included in the anti-tip mechanism 29 are the positions when the FOUP 6 has been placed on the side buffer 2.

As illustrated in FIGS. 3 to 5, one anti-tip mechanism 29 is disposed adjacent to each of the two ends of the bottom portion 23 in the Z-axis direction. The two anti-tip mechanisms 29 are symmetrically disposed with respect to the X-Y plane passing through the center of the bottom portion 23. The anti-tip mechanism 29 is provided with a restriction member 290, a rotation shaft 295, and springs 296.

The restriction member 290 can prevent the FOUP 6 from tipping by restricting the inclination of the FOUP 6 contained in the side buffer 2. The restriction member 290 is provided with a restriction portion 291 (first plate), an article receiving portion 292 (second plate), and a link portion 293 (third plate).

The restriction portion 291, the article receiving portion 292, and the link portion 293, are substantially rectangular plate-shaped members. The restriction portion 291 extends at a right angle from one side of the rectangular link portion 293. The width of the restriction portion 291 in a direction perpendicular or substantially perpendicular to the surface of the link portion 293 is shorter than the width of the article receiving portion 292 in the same direction.

The angle defined by the surface of the restriction portion 291 and the surface of the link portion 293 is substantially a right angle.

The article receiving portion 292 has an elongated shape and is disposed so as to be opposite to the restriction portion 291 across the link portion 293. The article receiving portion 292 is disposed, through the rotation shaft 295 described below, such that its longitudinal direction is parallel or substantially parallel to the X axis. The length of the article receiving portion 292 is determined according to the length in the X-axis direction of the FOUP 6, the shape and the width in the Z-axis direction of the lower flange 65, the distance between the restriction portion 291 and the article receiving portion 292, the width in the Z-axis direction of the restriction portion 291, and the like. The relationship between the length of the article receiving portion 292 and the length of the FOUP 6 when brought into the side buffer 2 is described later.

The link portion 293 extends at an angle perpendicular or substantially perpendicular to the surface of the article receiving portion 292 from the end of the article receiving portion 292 in the short direction. In other words, the link portion 293 connects the restriction portion 291 with the article receiving portion 292.

In the longitudinal direction of the article receiving portion 292, the length of the restriction portion 291 and the length of the link portion 293 are shorter than the length of the article receiving portion 292. The link portion 293 and the restriction portion 291 are disposed not at the center of the article receiving portion 292 in the longitudinal direction of the article receiving portion 292, but at a position closer to one end portion of the article receiving portion 292 (see figures). However, the shapes, numbers, and positions of the link portion and the restriction portion can be changed. Also, the magnitude correlations between the length of the restriction portion 291, the length of the link portion 293, and the length of the article receiving portion 292 can be changed.

As illustrated in FIG. 5, in a cross section (A-A cross section) which crosses through the restriction portion 291 and the link portion 293 and is parallel or substantially parallel to the Y-Z plane, the restriction member 290 has a U-letter shape, and specifically an angular U-letter shape. As illustrated in FIG. 5, the restriction portion 291 and the article receiving portion 292 are the portions which are opposite to each other in the cross section of the U-letter shape. The link portion 293 corresponds to the bottom portion of the U-letter shape. As mentioned above, in this cross section, in the direction perpendicular or substantially perpendicular to the surface of the link portion 293, the width of the restriction portion 291 is shorter than the width of the article receiving portion 292.

The restriction member 290 may be formed by folding a cross-sectional metal plate, through casting, or formed with materials such as a resin, for example.

The rotation shaft 295 is disposed in the corner between the article receiving portion 292 and the link portion 293 of the restriction member 290 in the longitudinal direction of the article receiving portion 292. Two ends of the rotation shaft 295 are held in the bearing holes (not shown) respectively disposed in the side panels 24. The bearing holes are disposed at lower portions of the side panels 24 (portions close to the bottom portion 23), and are adjacent to the front end and the rear end of the bottom portion 23. Thus, the rotation shaft 295 is disposed so as to be parallel or substantially parallel to the X-axis. In other words, the restriction members 290 are disposed at both sides of the bottom portion 23 in the Z-axis direction such that their longitudinal directions become parallel to the X-axis. The restriction member 290 can be rotated about the rotation shaft 295. By this rotation, the restriction portion 291 can be rotated about the rotation shaft 295.

Figure 7:
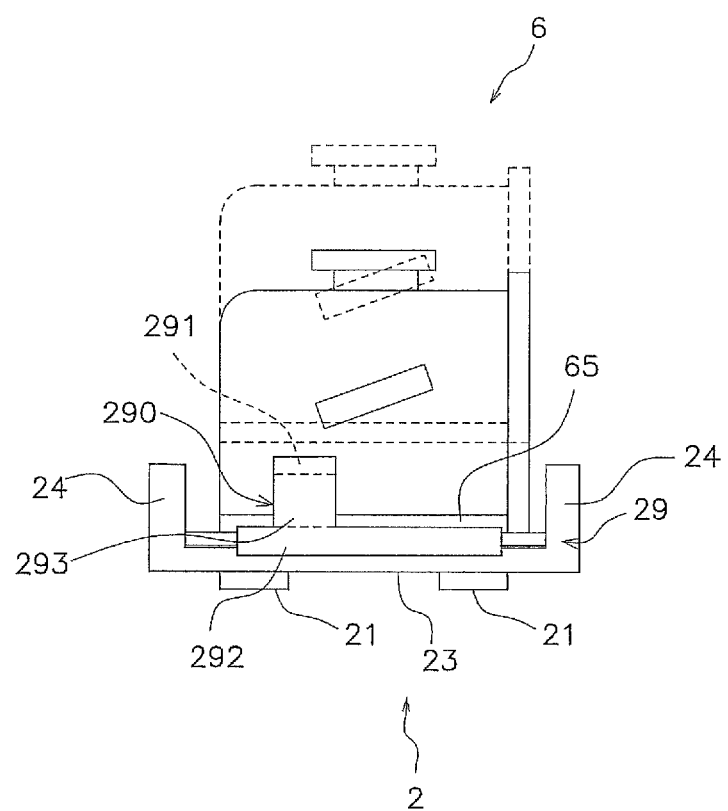
FIG. 7 is a view illustrating movement of the FOUP when the FOUP is to be placed onto the side buffer.
Figure 7:
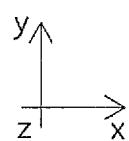

As illustrated in FIG. 7, while incorporated into the side buffer 2, one end of the article receiving portion 292 in the longitudinal direction is disposed adjacent to one end of the FOUP 6 in the X-axis direction. The other end of the article receiving portion 292 is disposed adjacent to the other end of the FOUP 6. Moreover, in FIG. 7, both ends of the article receiving portion 292 in the X-axis direction are disposed inside with respect to both ends of the FOUP 6 in the X-axis direction. However, as other preferred embodiments, the ends of the article receiving portion 292 in the X-axis direction may be located at the same positions as those of the ends of the FOUP 6 in the X-axis direction, or located outside with respect to the same.

As illustrated in FIGS. 3 to 5, the springs 296 are disposed adjacent to both ends of the rotation shaft 295. More specifically, the springs 296 are disposed closer to both ends of the rotation shaft 295 than the link portion 293 and the article receiving portion 292. The spring 296 is wound around the rotation shaft 295. A first end of each spring 296 abuts against the bottom portion 23, and the other end is fixed to the restriction member 290.

The springs 296 bias the restriction members 290 toward the directions in which the restriction members 290 are opened (i.e., the directions in which the distance between the restriction portions 291 of the two restriction members 290 is made longer).

In other words, the restriction member 290 on the front side receives a force from the springs 296 which causes the link portion 293 to be inclined toward the front panel 251. However, the inclination of this restriction member 290 with respect to the bottom portion 23 (with respect to the Z-X plane) is restricted by the front panel 251. As a result, the article receiving portion 292 of this restriction member 290 is disposed at a position where it may be pressed down by the FOUP 6, namely, a position where the article receiving portion 292 may receive a force from the FOUP 6.

Moreover, the restriction member 290 on the rear side (the right side in FIG. 5) receives a force from the spring 296 which causes the link portion 293 to be inclined toward the rear panel 252. However, the inclination of this restriction member 290 with respect to the bottom portion 23 is restricted by the rear panel 252. As a result, the article receiving portion 292 of this restriction member 290 is disposed at a position where it may be pressed down by the FOUP 6, namely, a position where the article receiving portion 292 may receive a force from the FOUP 6.

In other words, as illustrated in FIG. 5, with the rotation shaft and the front panel 251, the article receiving portion 292 is disposed closer to the center of the bottom portion 23 in the Z-axis direction than the link portion 293. In other words, the restriction member 290 is disposed such that the recess portion of its U-letter shape cross section is facing the inside of the frame member 20 in the Z-axis direction.

When the FOUP 6 is not placed on the side buffer 2, the restriction portion 291 is disposed at a retracted position due to the biasing by the spring 296 (FIG. 5). As will be describer later, when the FOUP 6 is placed onto the side buffer 2, by the placement operation of the lifting drive portion 40, the FOUP 6 is moved down along the vertical direction (Y-axis direction) from a position above the restriction member 290 to the bottom portion 23. The "retracted position" means a position which is out of the moving path of the FOUP 6 during the placement operation. In other words, it is a position where the restriction portion 291 is not pressed down by the FOUP 6 during the placement operation. Further, in other words, it is a position where the restriction portion 291 does not receive a force from the FOUP 6 during the placement operation (FIG. 5).

Figure 6:
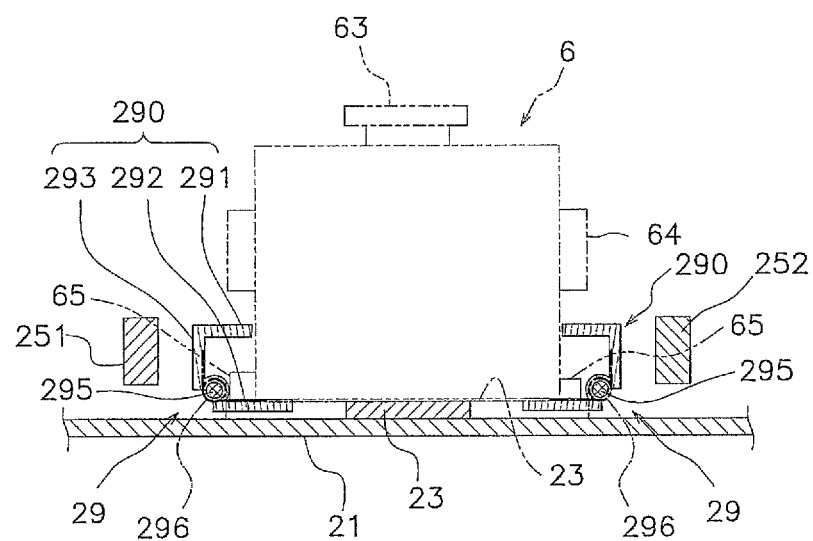
FIG. 6 is a cross-sectional view of the side buffer taken in the direction of arrow A-A in a state in which the FOUP is placed on the side buffer.
Figure 6:
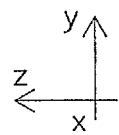

As will be described later, the article receiving portion 292 receives a force from the FOUP 6 when the FOUP 6 is placed onto the side buffer 2. The link portion 293, by transmitting this force to the restriction portion 291, moves the restriction portion 291. Specifically, when the FOUP 6 is placed onto the article receiving portion 292, the article receiving portion 292 receives force in the downward direction (the negative direction of Y-axis). Because the restriction member 290 can be rotated about the rotation shaft 295, the article receiving portion 292 moves downward due to this force. Because the link portion 293 is connected with the article receiving portion 292, the link portion 293 is also rotated about the rotation shaft 295. Because the link portion 293 is also connected with the restriction portion 291, the restriction portion 291 is also rotated about the rotation shaft 295. Thus, the restriction portion 291 is moved from the retracted position to a restricting position (FIG. 6). That is, the link portion 293 moves the restriction portion 291 from the retracted position to the restricting position based on the force received by the article receiving portion 292. The details of the movement of the restriction portion 291 are described later with reference to FIG. 6.

1-5. Operation of Conveying Vehicle System 1

Referring to FIG. 2, the operation of the conveying vehicle system 1 is described.

In the conveying vehicle system 1, according to an instruction from a host controller, the conveying vehicle 3 is loaded with a FOUP 6 from a processing apparatus 9, and is moved along the traveling rail 30, thereby conveying the FOUP 6 to another processing apparatus 9.

As illustrated in FIG. 2, the processing apparatus 9 is provided with a load port 91 and a gateway 92.

The FOUP 6 is placed onto the load port 91 of the processing apparatus 9 as the destination by the conveying vehicle 3. A substrate in the FOUP 6 is taken out by a robot and processed by the processing apparatus 9. After the completion of the processing, the substrate is returned to the FOUP 6. The conveying vehicle 3 then conveys the FOUP 6 to a next destination.

The FOUP 6 may be placed onto the side buffer 2 by the conveying vehicle 3. By placing the FOUP 6 onto the side buffer 2, the timing of conveyance to the processing apparatus 9 maybe adjusted.

1-6. Placement on Side Buffer

Referring to FIG. 2 and FIGS. 5 to 7, the placement of the FOUP 6 onto the side buffer 2 is described. In FIG. 6, similar to FIG. 5, the FOUP 6 is illustrated with two-dot chain lines, and the portions disposed in front of the cross section are illustrated with alternate long and short dash lines. In FIG. 7, the FOUP 6 placed on the side buffer 2 is illustrated with solid lines, and the FOUP 6 removed from the side buffer 2 is illustrated with dotted lines. In FIG. 7, some components, such as the front panel 251 and the rear panel 252, are omitted from the figure.

As illustrated in FIG. 5, when the FOUP 6 is not placed on the side buffer 2, the two restriction members 290 are kept in the opened state (the state in which the distance between the restriction portions 291 of the two restriction members 290 is large) due to the biasing by the springs 296. In this state, the distal end of the article receiving portion 292 is disposed at a position higher than the bottom portion 23 at the region where the FOUP 6 may be placed. Moreover, in this state, the restriction portion 291 is located at the retracted position, which is out of the region where the FOUP 6 may be placed, thereby enabling the FOUP 6 to move between the bottom portion 23 and a position directly above the bottom portion 23.

As illustrated in FIG. 7, by lowering the FOUP 6 in the vertical direction from above the restriction member 290, the FOUP 6 is placed onto the side buffer 2. Specifically, the FOUP 6 is moved to a position above the bottom portion 23 and the restriction portion 291 by moving the FOUP 6 in X-axis direction with the lateral movement mechanism 39 while being held by the lifting table 41 (horizontal movement operation). Next, the FOUP 6 is lowered in the vertical direction by the lifting drive portion 40 (lowering operation). The moving directions of the FOUP 6 are also designated by arrows D1 and D2 in FIG. 2.

As illustrated in FIG. 6, the article receiving portion 292 is pressed down by the FOUP 6 that is being lowered. When the article receiving portion 292 is pressed down, the restriction member 290 is rotated about the rotation shaft 295. Specifically, when the link portions 293 transmit the force received by the article receiving portions 292 to the restriction portions 291, the restriction portion 291 of the restriction member 290 on the front side (the left side in FIG. 6) is rotated clockwise in FIG. 6, and the restriction portion 291 of the restriction member 290 on the rear side (the right side in FIG. 6) is rotated counter-clockwise in FIG. 6.

Finally, the article receiving portion 292 is pressed down by the FOUP 6 to the same height as that of the bottom portion 23 (FIG. 6). As a result, the link portion 293 takes an upright position such that it is parallel or substantially parallel to the Y-axis. Moreover, the restriction portion 291 is moved to the restricting position. The "restricting position" means a position directly above the lower flange 65 of the FOUP 6. Thus, the restriction members 290 are brought into a closed state (the state in which the distance between the restriction portions 291 of the two restriction members 290 is small). The lower flange 65 is sandwiched between the restriction portion 291 and the article receiving portion 292 in the Y-axis direction.

1-7. Anti-Tip Function

Figure 8:
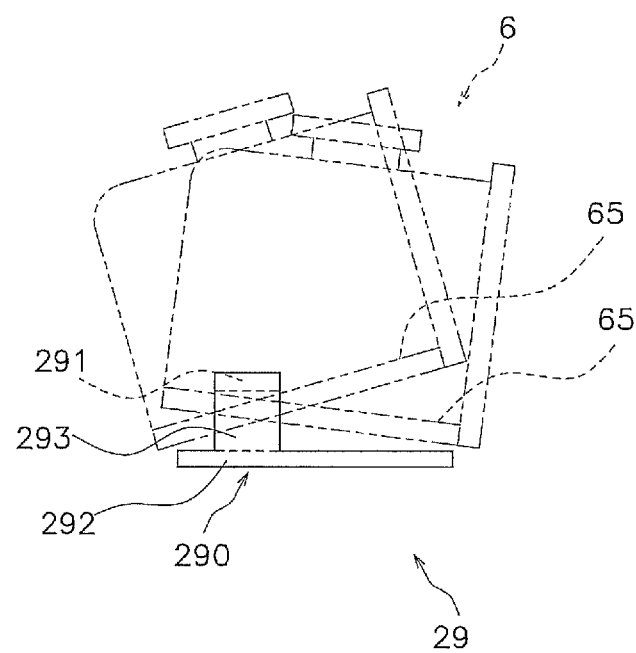
FIG. 8 is a view illustrating the tipping prevention of the FOUP by the restriction member when the FOUP tilts.
Figure 8:
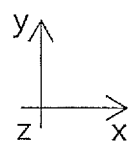

The function of the restriction member 290 when the FOUP 6 is inclined due to an earthquake, and the like, is described with reference to FIG. 8. In FIG. 8, the FOUP 6, which is shaken and inclined with respect to the side buffer 2, is illustrated with dotted lines. The components of the side buffer 2 other than the restriction member 290 are omitted from the figure.

As illustrated in FIG. 8, even when the FOUP 6 is inclined toward the left or right direction (in the X-Y plane direction), tipping of the FOUP 6 can be prevented by the restriction member 290. This is because the positions of the restriction portions 291 hardly change even when the FOUP 6 is inclined. In other words, even when the FOUP 6 is inclined, the restriction portion 291 can restrict the range of movement of the lower flange 65. As a result, the inclination of the FOUP 6 is restricted with respect to the side buffer 2.

Next, the reason why the positions of the restriction portions 291 hardly change even when the FOUP 6 is inclined is described. Because the restriction member 290 is disposed in a way such that the FOUP 6 is placed on the article receiving portion 292, even when the FOUP 6 is inclined, the range of movement of the article receiving portion 292 (the rotation angle of the restriction member 290) is restricted by the weight of the FOUP 6.

Thus, even when the FOUP 6 is inclined, the range of movement of the article receiving portion 292 is restricted so that the range of movement of the restriction portion 291 is also restricted, thereby restricting the movement of the lower flange 65.

In other words, the restriction portion 291 is disposed in a way such that its restricting position can be maintained even when the FOUP 6 is inclined. More specifically, factors such as the distance between the restriction portion 291 and the article receiving portion 292, the position of the end portion of the restriction portion 291 with respect to the lower flange 65 in the X-axis direction, the length of the article receiving portion 292 in the X-axis direction, and the position of the end portion of the article receiving portion 292 with respect to the end portion of the FOUP 6 in the X-axis direction, are set such that the restriction portion 291 abuts against the lower flange 65 when the FOUP 6 is inclined. In other words, when the FOUP 6 is inclined, the lower flange 65 abuts against the restriction portion 291 at the upper limit within the movable range of the restriction portion 291 which is restricted by the FOUP 6.

1-8. Movement of FOUP from Side Buffer

When the FOUP 6 is moved from the side buffer 2 to another location by the conveying vehicle 3, the FOUP 6 is held by the lifting table 41, and moved upward in the vertical direction by the lifting drive portion 40 (FIG. 5 and FIG. 7). Then, FOUP 6 is housed between the two covers 37 by the lateral movement mechanism 39. After that, the FOUP 6 is conveyed to the next destination by the conveying vehicle 3.

In this manner, the anti-tip mechanism 29 does not interfere with the placement and the taking-out of the FOUP 6 from the side buffer 2 in the vertical direction. In other words, the tipping of the FOUP 6 is effectively prevented, and the FOUP 6 can also be smoothly taken-in and taken-out with respect to the side buffer 2.

The FOUP 6 can be taken-in and taken out not only in the direction D1 of FIG. 2, but also in the direction D2. In other words, the FOUP 6 can be taken-in and taken-out from both the positive and negative directions of the X-axis with respect to the side buffer 2. The reason why such taking-in and taking-out operations in the two directions can be performed is that, because the restriction portion 291 is moved to the retracted position, it does not interfere with the taking-in and taking-out operations of the FOUP 6.

The taking-in and taking-out operations in the two directions can be implemented by, for example, disposing rails on both sides of the side buffer 2 in the X-axis direction. By disposing the rails in this manner, the FOUP 6 may be taken-in and taken-out with respect to the side buffer 2 at both left and right sides in FIG. 2 by the conveying vehicle 3.

Note that, the FOUP 6 may be taken-in in the direction D1 and taken-out in the direction D2, or may be taken-in in the direction D2 and taken-out in the direction D1.

Moreover, according to the side buffer 2, because the restriction member 290 is provided, there is no need to increase the heights of the side panels 24, the front panel 251, and the rear panel 252 in order to prevent the FOUP 6 from tipping. Therefore, the lifting distance of the FOUP 6 during taken-in and taken-out with respect to the side buffer 2 can be reduced. Accordingly, when the FOUP 6 is transferred by the vehicle 3 from the lifting table 41 to the side buffer 2 and vice versa, the operation time of the conveying vehicle 3 which is transferred can be shortened.

As described above, the restriction members 290 can take the first position illustrated in FIG. 5 and the second position illustrated in FIG. 6 by rotating about the rotation shafts 295. In the first position, the restriction members 290 are opened outward in the Z-axis direction, and the restriction portions 291 are located at the retracted positions. Therefore, the restriction portions 291 do not interfere with the placement of the FOUP 6 onto the bottom portion 23. Moreover, in the second position, the restriction members 290 are closed inward in the Z-axis direction, and the restriction portions 291 are located at the restricting positions. Therefore, even when the FOUP 6 is inclined with respect to the side buffer 2 as illustrated in FIG. 8, the inclination of the FOUP 6 is restricted. Note that, when the FOUP 6 is moved upward by the conveying vehicle 3, the FOUP 6 separates from the article receiving portion 292 so that the restriction members 290 are brought into the first position from the second position by the springs 296. Therefore, the restriction portions 291 do not interfere with the lifting movement of the FOUP 6. As described above, the restriction members 290 provide restriction against an inclination of the FOUP 6, but do not provide restriction against the movement of the FOUP 6 in the upward and downward directions.

2. Second Preferred Embodiment

Figure 9:
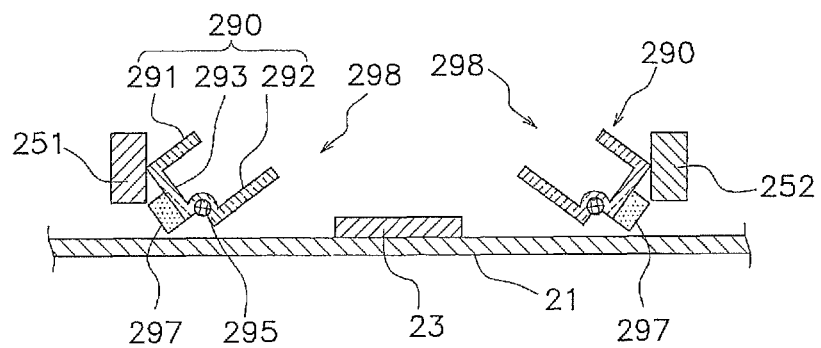
FIG. 9 is a cross-sectional view illustrating an anti-tip mechanism according to another preferred embodiment of the present invention.

Referring to FIG. 9, a side buffer according to a second preferred embodiment is described. The side buffer according to the second preferred embodiment preferably includes the same configuration as that of the side buffer 2 of the first preferred embodiment, except that the springs 296 are replaced with weights 297 as the biasing portions. Therefore, the components which have already been described are omitted from the following description and from the figure.

As illustrated in FIG. 9, an anti-tip mechanism 298 of the side buffer according to this preferred embodiment is provided with the weights 297. The weight 297 is fixed to the outer surface of the bottom of the U-letter shaped restriction member 290. In other words, the weight 297 is fixed to the outer surface of the link portion 293. The weight 297 may integral with the restriction member 290, for example, so as to define a single unit.

As illustrated in FIG. 9, when the FOUP is not placed on the side buffer, the restriction member 290 on the front side is inclined toward the front panel 251 due to the weight 297, and the restriction member 290 on the rear side is inclined toward the rear panel 252 due to the weight 297. Thus, the restriction portion 291 is disposed at the retracted position. That is, the center of gravity of the anti-tip mechanism 298 (the restriction member 290 and the weight 297) is set such that the restriction member 290 is biased toward the retracted position.

As described in the first preferred embodiment, when the FOUP is placed onto the side buffer, the FOUP is lowered from directly above the side buffer. As a result, the article receiving portion 292 is pressed down by the FOUP 6. When the restriction member 290 is rotated about the rotation shaft 295, the restriction portion 291 is moved to the restricting position.

3. Other Preferred Embodiments

Preferred embodiments of the present invention has been described above, but the present invention is not limited to the above preferred embodiments, and can be variously modified within the scope without departing from the gist of the present invention.

In the first and second preferred embodiments, the restriction portion 291, the article receiving portion 292, and the link portion 293 preferably are integrally included in the restriction member 290. However, the restriction portion 291, the article receiving portion 292, and the link portion 293 may be formed as individually separable members.

In the first and second preferred embodiments, the movement of the restriction portion 291 preferably is restricted by the front panel 251 and the rear panel 252 when the FOUP 6 is not placed. However, any other members for restricting the movement of the restriction portion 291 may be disposed, and an additional member that restricts force of the spring 296 (biasing portion) may be provided.

In the first and second preferred embodiments, the restriction member 290 and the rotation shaft 295 are separate members. However, the restriction member 290 and the rotation shaft 295 may be integral with each other to define a single unit. Moreover, when the restriction portion 291 preferably is a member separable from the article receiving portion 292 and the link portion 293, the rotation shaft 295 may be attached to the restriction portion 291, and the restriction portion 291 and the rotation shaft 295 may be integral with each other to define a single unit.

In the first and second preferred embodiments, when the FOUP 6, which is an article, is placed on the side buffer 2, the bottom of the FOUP 6 is preferably supported by mainly the bottom portion 23 of the frame member 20. However, the bottom portion 23 of the frame member 20 may be omitted if the bottom portion of the article can be supported by the article receiving portion 292 by appropriately setting the size and strength of the article receiving portion 292. In other words, the article receiving portion may also function as the placement portion.

In the first and second preferred embodiments, the restriction portions 291 are preferably disposed so as to abut against both ends of the FOUP 6 in the Z-axis direction (first position). Moreover, the article receiving portions 292 are preferably disposed such that portions of the FOUP 6 near the two ends in the X-axis direction (second directions) are placed on the article receiving portions 292. The X-axis is perpendicular to the Z-axis.

However, the configurations in these preferred embodiments are merely examples of the configuration "when the restriction portions are positioned on two sides of the article in a first direction, and the article is placed on the placement portion, the article receiving portion is disposed such that portions of the article near the end portion in a second direction transverse to the first direction are placed on the article receiving portion". That is, the second direction is not necessarily perpendicular to the first direction. Moreover, the article receiving portion is not necessarily disposed such that both ends of the article are placed on the article receiving portion, but may be disposed such that only a portion of the article near one end is placed thereon.

Preferred embodiments of the present invention have been described above, but the present invention is not limited to the above preferred embodiments, and can be variously modified within the scope without departing from the gist of the invention. Specifically, the plurality of preferred embodiments and their modified examples described herein can be optionally combined with one another based on the need or preference.

Preferred embodiments of the present invention are applicable to a placement table and a conveying vehicle system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A side buffer disposed in a conveying vehicle system including a conveying vehicle traveling along a ceiling, the side buffer comprising:
   a placement portion on which an article may be placed;
   a suspension member arranged to suspend the placement portion from the ceiling;
   a restriction portion movable between a restricting position, where an inclination of the article on the placement portion is restricted, and a retracted position, where the article is allowed to be moved among the placement portion, a position directly above the placement portion and above the restriction portion, and a position directly above the placement portion and below the restriction portion, the restriction portion being disposed at each of two sides of the article in a traveling direction of the conveying vehicle when the restriction portion is at the restricting position;
   an article receiving portion disposed such that, when the article is placed on the placement portion, portions of the article at an area of end portions in a horizontal direction and perpendicular or substantially perpendicular to the traveling direction are placed on the article receiving portion so as to receive a force from the article placed on the placement portion; and
   a link portion configured to move the restriction portion from the retracted position to the restricting position with the received force.

2. The side buffer according to claim 1, further comprising a biasing portion configured to bias the restriction portion toward the retracted position.

3. The side buffer according to claim 1, further comprising a first plate defining the restriction portion, a second plate defining the article receiving portion which is opposite to the first plate, and a third plate defining the link portion which connects the first plate with the second plate.

4. The side buffer according to claim 3, wherein the first plate, the second plate, and the third plate have a U-letter shape.

5. The side buffer according to claim 1, wherein the restriction portion, the article receiving portion, and the link portion are integral with each other.

6. The side buffer according to claim 5, further comprising a biasing portion configured to bias the restriction portion toward the retracted position.

7. The side buffer according to claim 6, further comprising a rotation shaft, wherein the restriction portion is rotatable about the rotation shaft.

8. The side buffer according to claim 5, further comprising a rotation shaft, wherein the restriction portion is rotatable about the rotation shaft.

9. The side buffer according to claim 1, further comprising a rotation shaft, wherein the restriction portion is rotatable about the rotation shaft.

10. The side buffer according to claim 1, wherein the article includes a protrusion on its surface, and the restriction portion is disposed such that an inclination of the article is restricted by restricting a range of movement of the protrusion at the restricting position.

11. The side buffer according to claim 1, further comprising:
   a first unit including the restriction portion, the article receiving portion, and the link portion; and
   a second unit including another restriction portion, another article receiving portion, and another link portion; wherein
   the first unit is disposed on one side of the placement portion, and the second unit is disposed on the other side which is opposite to the one side where the first unit is disposed.

12. A conveying vehicle system comprising:
   a side buffer according to claim 1; and
   a conveying vehicle configured to travel along the ceiling, and to move the article between the placement portion and a position directly above the placement portion and higher than the restriction portion.

* * * * *